United States Patent [19]

Saito et al.

[11] Patent Number: 4,810,290

[45] Date of Patent: Mar. 7, 1989

[54] AGGLOMERATED ORES AND A PRODUCING METHOD THEREFOR

[75] Inventors: Hiroshi Saito, Tokyo; Noboru Sakamoto; Hiroshi Fukuya, both of Kanagawa; Yoshihito Iwata, Tokyo, all of Japan

[73] Assignee: Nippon Kokan Kabushiki Kaisha, Tokyo, Japan

[21] Appl. No.: 105,517

[22] Filed: Oct. 1, 1987

Related U.S. Application Data

[60] Continuation of Ser. No. 871,305, Jun. 6, 1986, abandoned, which is a division of Ser. No. 769,624, filed as PCT JP85/00192 on Apr. 12, 1985, published as WO86/02668 on May 6, 1986, Pat. No. 4,722,750.

[30] Foreign Application Priority Data

Oct. 31, 1984 [JP] Japan ................................. 59-227944

[51] Int. Cl.$^4$ ............................................. C22B 1/20
[52] U.S. Cl. ................................................... 75/257
[58] Field of Search ........................... 75/5, 0.5 R, 257

[56] References Cited

U.S. PATENT DOCUMENTS 4,082,540  4/1978  Sasaki et al. ............................. 75/5
4,129,437  12/1978  Taguchi et al. .......................... 75/5

Primary Examiner—Melvyn J. Andrews
Attorney, Agent, or Firm—Moonray Kojima

[57] ABSTRACT

Mini-pellets made of raw materials of fine powder iron ores are indurated, and effected with diffusion bond. A plurality of said treated mini-pellets are combined with calcium ferrites at the surface layers thereof. Thus, agglomerated ores are produced, wherein main grain sizes of said fine powder iron ores are not more than 5 mm, and are subjected to a primary pelletization with flux, and solid fuels are coated in a secondary pelletization to produce the mini-pellets of 3 to 9 mm diameter, and the produced mini-pellets are undertaken with induration in a travelling grate typed sintering furnace.

Depending upon the present agglomerated ores and the producing method therefor, the raw materials may be selected from a wide range of grain sizes, and a blow faculty is enough to be small, and producing yield of the agglomerated ores may be increased, having improved qualities of high RI and low RDI.

13 Claims, 5 Drawing Sheets

10mm

FIG_1
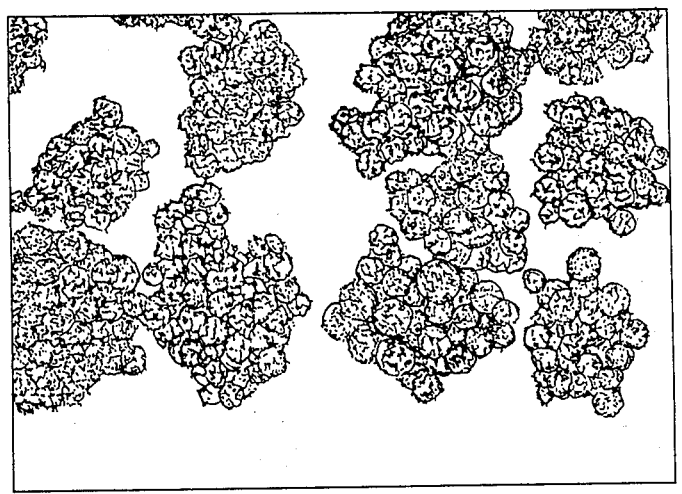
10mm
FIG_2
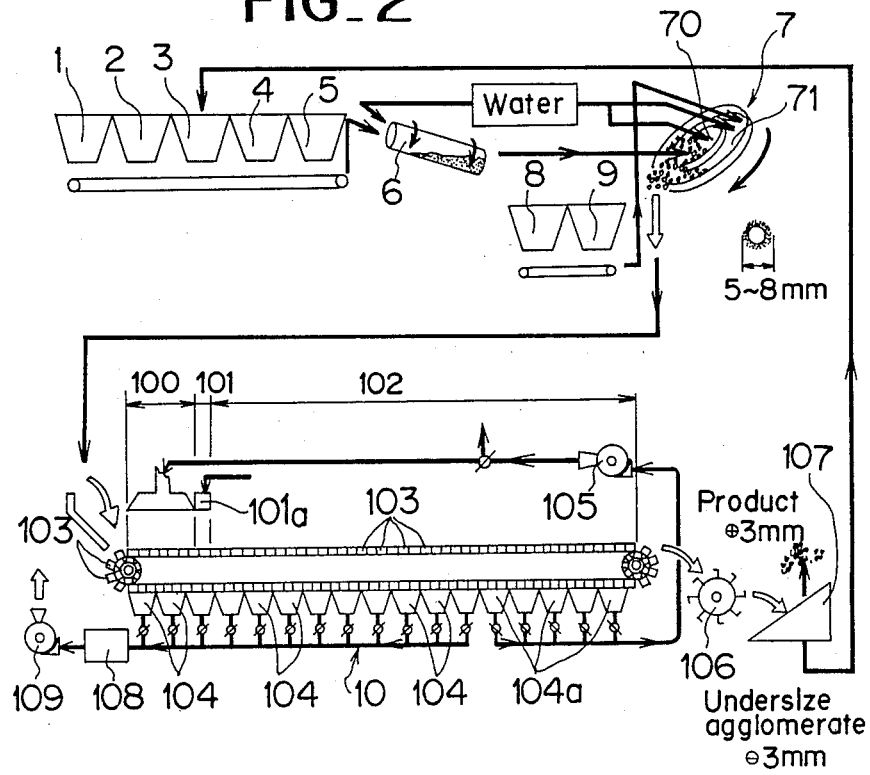

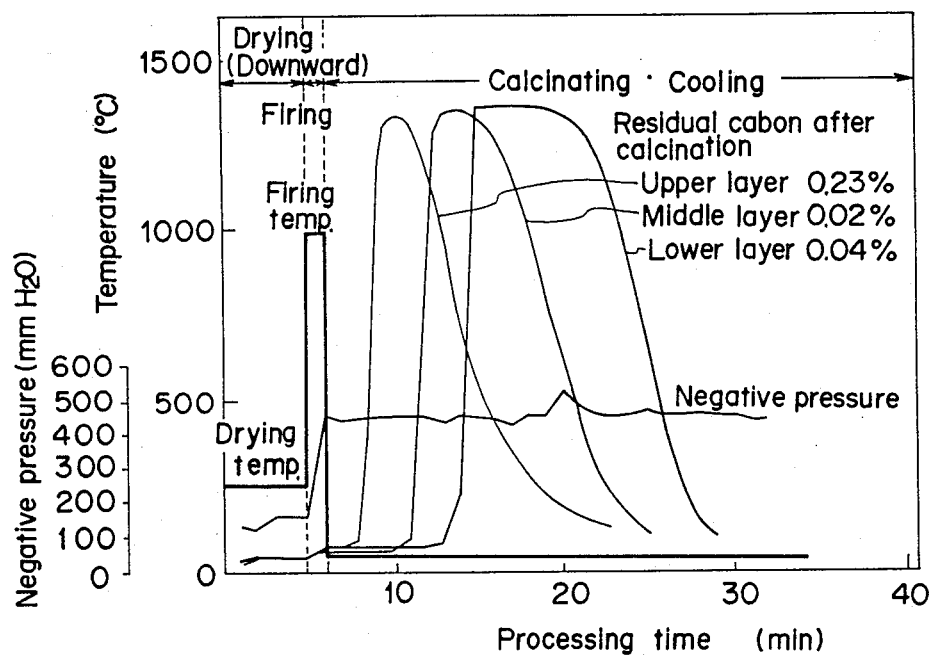
FIG_3
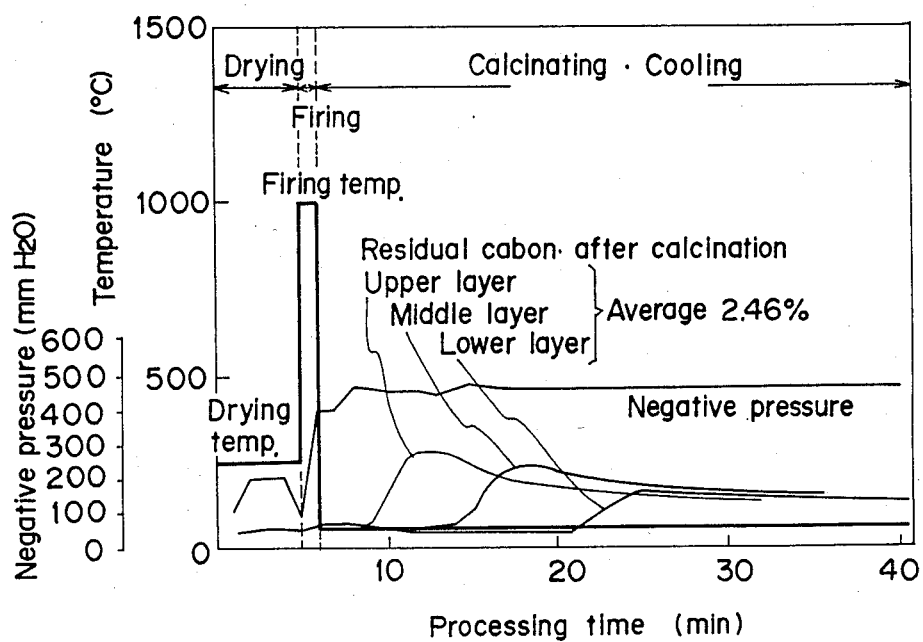
FIG_4

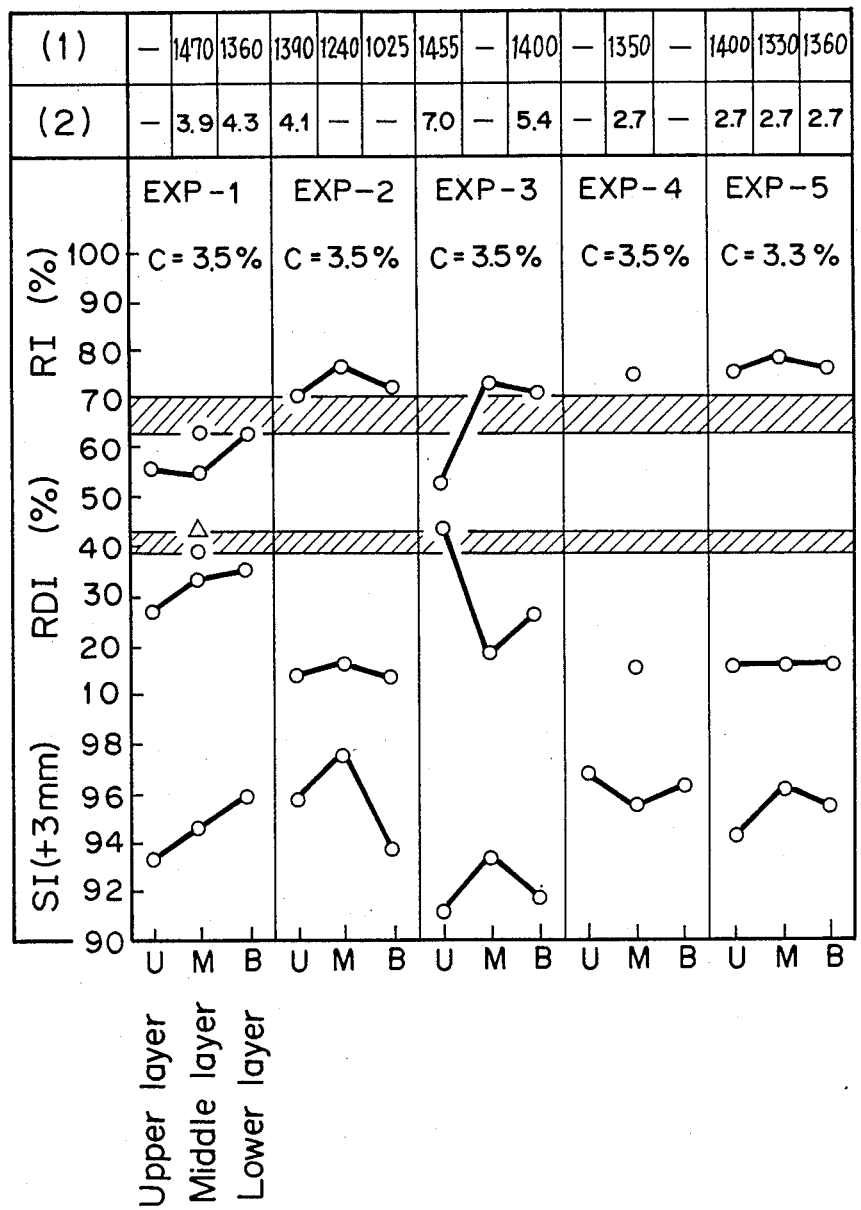
FIG_5(a)

FIG_5(b)
(1) Maximum temperature
(2) Maintaining time (min) at temperatures of more than 1250 °C
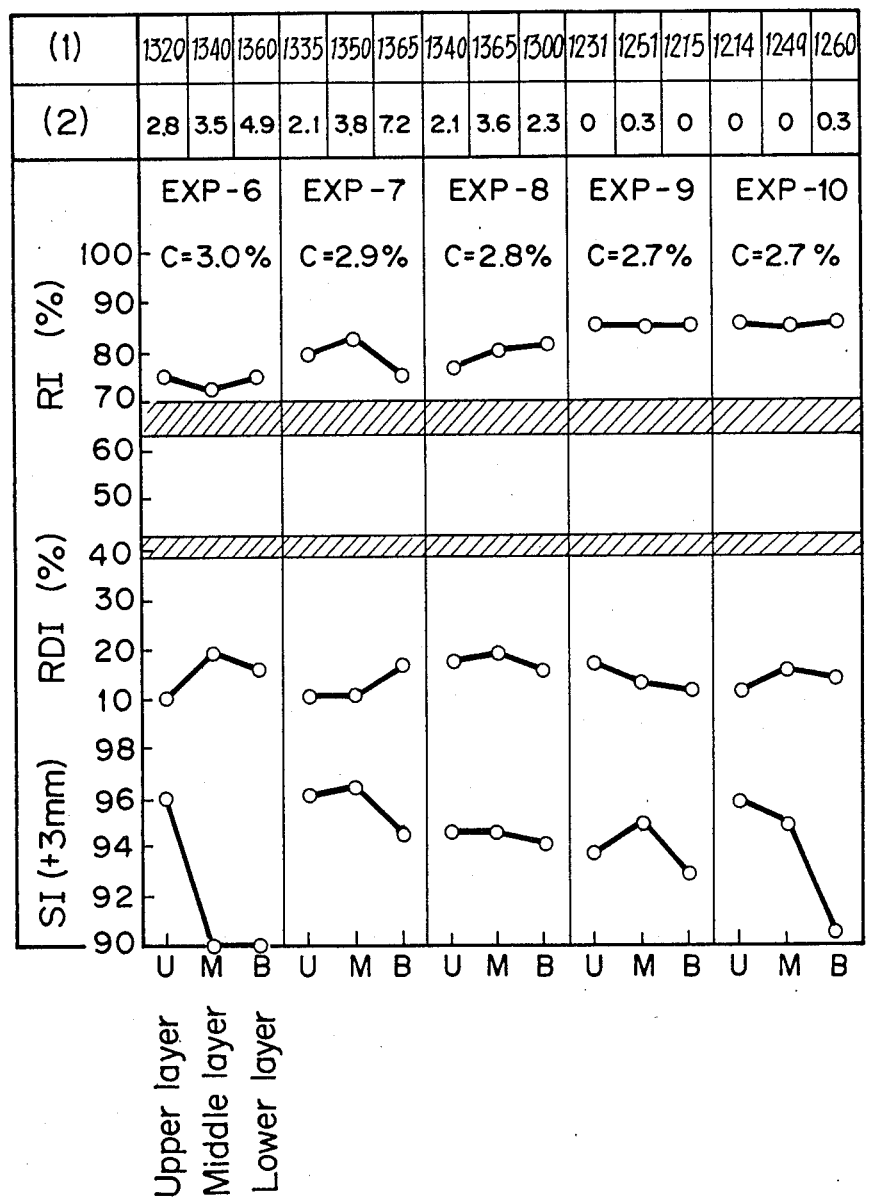

FIG_6
(a)
(b)
(c)
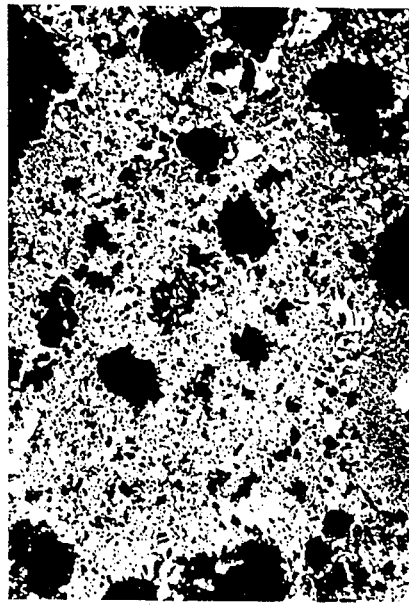

AGGLOMERATED ORES AND A PRODUCING METHOD THEREFOR

This application is a continuation of application Ser. No. 871,305 filed 6-6-86 now abandoned which is a division of application Ser. No. 769,624 filed as PCT JP85/00192 on Apr. 12, 1985, published as WO86/02668 on May 6, 1986, now U.S. Pat. No. 4,722,750.

TECHNICAL FIELD

This invention relates to new agglomerated ores and a producing method therefor. Objective ores have excellent properties at high temperatures, high RI, low RDI and high producing yield. These ores are produced from fine powder iron ores having so wide range of grain sizes to an extent that they are not always suitable to sintering nor pellets. The invention is to provide a producing method which enables to carry out induration by means of a blower of low faculty.

BACKGROUND OF THE INVENTION

In general, the fine powder ores as raw materials for sintering or pelletizing have ranges of proper grain sizes. For example, in a sintering process of DL type, grains are mixed in a mixer of drum type, but since a pelletizing time is short, perfect agglomeration of ores could not be performed. Therefore, for maintaining permeability, such a condition is burdened that the grain sizes of raw iron ore of not more than 125 $\mu$m should be below 20%, preferably not more than 10%. Notwithstanding said conditions, the blower faculty of around 1500 to 2000 mmAq is required during sintering, because of bad permeability in the sintered bed. Further, because products are crushed and regulated in grain size, yield is undesirable, and 70% at the most. Sources of $SiO_2$ are added such that the content of $SiO_2$ in the product is about 5 to 7% in order to increase bonding power, and strength of the sintered ores is maintained, but on the other hand, amount of generating slags within the furnace is increased and RI (Reduction Index) is generally decreased as 60 to 70%.

In a travelling grate typed pellet sintering process, the powder iron ores should be pelletized more than 10 mm$\phi$ in a preceding process. Therefore, with respect to the grain sizes of the raw powder iron ores, those of not more than 44 $\mu$m is necessarily 60 to 90%, preferably more than 80%, for smoothly performing pelletization. The obtained pellets are good in reducing nature. However, since they are relatively large in grain diameter, the reduction does not reach to nuclei of the pellets in the shaft zone of a furnace, so that there remain non-reduced parts which are low in melting points, thereby to widen softening and melting zones at high temperature range within the furnace, and bad influences are given to the operation. Being low in the amount of containing veinstones, swelling phenomena occur and are pulverized within the shaft zone. In addition, the pellets are like ball and are not bonded one another but each independent. When charging into the furnace, they gather to a center part from the circumference thereof, so that the gas flowing distribution is disturbed and cannot be effectively used to the reduction.

The present invention has been realized to solve the above mentioned problems. The agglomerated ores by the invention have excellent properties at high temperatures, high RI, low (Reduction Degradation Index) and high production yield. These ores are produced from the fine iron ores having so wide range of grain sizes that they are not suitable to sintering and pelletization. The invention is to provide the producing method which enables to carry out induration by means of the blower of the low faculties.

DISCLOSURE OF THE INVENTION

The invention will be explained in detail. The raw iron ores for sintering are crushed if exceeding 5 mm of the grain size, and main grain sizes are not more than 5 mm. Mini-pellets comprise such iron ores, and the agglomerated ores are produced by indurating the mini-pellets.

Thus, since the powder iron ores are prepared as pellets when the induration is carried out, they are permeable and so the small blowing faculties are sufficient. The conventional pellets are, as mentioned above, produced by merely pelletizing and indurating the powder iron ores, and when charging them into the furnace, they flow toward the center part from the circumferential of the furnace. The inventors made contrivances in this respect and produced new ores by bonding the pellets one another as seen in FIG. 1, so that they do not roll over in the furnace as the conventional sintered ores. That is, the pellets are effected with diffusion bond, and groups of a plurality of the pellets are bonded with calcium ferrite on their surfaces. As a result, the agglomerated ores are provided by combining the plurality of the pellets. Although they are crushed and regulated in grain size, they are not reduced into powders and may be used, so that the production yiled is heightened as well. Besides, since the addition of $SiO_2$ is low ($SiO_2$: 3.5 to 4.5%, CaO: 7 to 9%, CaO/$SiO_2$: 2), the production of slags is low, thereby enabling to accomplishe the high RI. Further, the agglomerated ores are, as seen in FIG. 1, as a whole different from the pellets, and have similar shape to sintered ores. They distribute uniformly over within the furnace. The utilization of the gas is made higher than conventionally.

If the pellets were effected with diffusion bond in the induration process, they would have fine structures with micro bores composed of fine hematites and fine calcium ferrites. This fact confirms that IR is high. On the other hand, if the pellets were effected with melting bond under a condition that the amount of $SiO_2$ is high as the sintered ores, the structure would be composed of large secondary hematites and prismatic calcium ferrites, and the macro bores to be much formed would be bad in permeability, because the slags are fused away with a result of low RI.

The pelletizing sizes have been normally above 10 mm, but those exceeding 9 mm are, at drying and indurating, influenced with difference in temperature between the center parts and surface parts thereof, and easily invite bursting due to the heat shock and are subject to pulverization. On the other hand those of less than 3 mm make permeability bad during induration. In view of these circumstances, the above mentioned agglomerated ores are produced by indurating mini-pellets of 3 to 9 mm diameter, preferably 5 to 8 mm.

For natures of grain iron ores to be raw materials, it is desirable that the hematite materials are more than 80% and the magnetite materials are less than 20% in order not to increase magnetites existing products. With respect to the grain sizes, it is sufficient that the main grain sizes are not more than 5 mm, and no problems arise about using any one of ordinary sintered raw materials of $-125$ $\mu$m being not more than 10%, ordinary pellet raw material of $-44$ $\mu$m being more than 60%, or middle ones therebetween. If the main grain size is not more than 1 mm, initial ores do not remain in agglomerated ores to be provided by induration, and will be more desirable in quality of the structure. "Reduction index" (called herein "RI") is the reduced amount of samples of 500 g which have been reduced for 3 hours within a reacting tube of inner diameter of 75 mm under conditions of 30% $CO + 70\% N_2$, 900° C. and 15 min. "Reduction degradation index" (called herein "RDI") is the amount of filtered samples after reducing, that is, materials are reduced under the same conditions as in RI (but wherein the reducing temperature is 550° C. and reducing time is 30 min.) and subjected, in a rotary test machine to 900 rotations at 30 rpm for 30 min., and then filtered through screens of 3 mm size. The amount of filtered samples of +3 mm is referred to as the RDI. "Shutter index" (called herein "SI") is the amount of samples filtered thought a specific filter size, namely, samples of 20 Kg are dropped successively four times from a height of 2 meters, and then subjected to filtering of 10 mm size, wherein the amount of samples of +10 mm is referred to as the SI.

The producing process of the above mentioned agglomerated ores will be explained.

At first, the above mentioned raw materials are subjected to a primary pelletization with a flux, and subsequently to a secondary pelletization where solid fuels are coated on the surfaces of primary pelletized ones to produce mini-pellets of 3 to 9 mm grain size.

Said coating of the solid fuel is performed because of the diffusion bond to be made on the surfaces of the mini-pellets in a coming induration process. As the solid fuel, sufficient are grain coke, grain cha, dust coal, grain petroleum coke, or grain charcoal, and the grain size of $-125 \mu m$ is preferably more than 50%. It is optimum that the solid fuels are added to the raw materials 2.5 to 3.5%, preferably 2.7 to 3.0%. If the lower limit were less than 2.5%, the whole calory would be insufficient to form structures in the existing process, and if the upper limit were more than 3.5%, structures would be inferior in reduction due to too high temperature within the layer. For the flux to be used to pelletization, it is sufficient to add lime substances in the amount to be determined in dependence upon basicity of 1.8 to 2.0 in products. For strengthening bondage of the pellets by calcium ferrites, parts of the flux should be added together with the solid fuels in the secondary pelletization. When the inventors added the total 7.3% and 4% thereof in the primary pelletization, and added 3.3% in the secondary pelletization, the indurations were each completely performed. However, when the addition was 2% in the primary pelletization and 5.3% in the secondary one, the induration time was short and the temperature was not increased, so that the indurations were incomplete. It was found through repetition of experiments, that the addition of the flux exceeding 50% of the total addition in the secondary pelletization would hinder combustion of the solid fuel. Therefore, it was preferable to add the flux being more than 50% of the total amount in the primary pelletization.

The above mentioned mini-pellets are indurated in the travelling grate sintering furnace which has drying, firing, indurating and cooling zones. The instant process is different from an ordinary sintering process, in providing the drying zone before the firing zone. This is why, since an object to be indurated is the agglomerated one composed of the mini-pellet, the bursting due to the heat shock at firing must be avoided. As the indurating conditions, it is preferable that 1270° C. is the maximum, and the temperature of more than 1250° C. is maintained within 1 minute. If these conditions were exceeded, it would be difficult to make diffusion bond on the surfaces of the minipellets with calcium ferrites. That is, because the minipellets are provided with diffusion bond, and each of the minipellets is composed of the large secondary hematite and the prismatic calcium ferrite, and the ratio of crystallized slags is heightened. In view of the object of the invention, the waste heat should be used in the indurating and cooling zones for the heat source of the drying zone.

In the thickness of the layer were 300 to 550 mm, including a hearth layer when the mini-pellets were charged into the pallet of the travelling grate sintering furnace, it would be sufficient to carry out the downward drying only in the drying zone. In the existing induration process dealing the conventional pellets, if the drying were carried out in the downward drying only, the water would gather in the lower layer, and the green pellets would be broken. Therefore, the upward drying has been performed prior to the downward drying. As a result, the drying process complicately continues from the upward drying to the downward drying, and in addition, dusts fly about outsides during the upward drying. However, the inventors have found that if the layer thickness were not more than 550 mm, the green pellet (the mini-pellet) of the lower layer could be prevented from destroying. However, if the layer thickness were less than 300 mm, the resistance in permeability would be lowered, so that the flowing rate of the hot blast was heightned in passing through the pellet layer, and the combustion of the solid fuel on the surface of the pellet was ended shortly, and the sufficient heat was not given to pellets during the combustion, so that the desied agglomerated ores could not be obtained.

The mini-pellets having passed through the indurating and cooling zones are agglomerated, and are subjected to crushing and filtering, and those of more than 3 mm will be products and those of less than 3 mm are returned to be re-used as raw materials.

BRIEF DESCRIPTION OF THE DRAWINGS

FIG. 1 is a view showing structures of grains of agglomerated ores produced by combining pellets according to the invention;

FIG. 2 is an explanatory view of a process, showing one example of producing agglomerated ores by a second invention of a producing process;

FIG. 3 is a graph showing heat patterns during induration for agglomerated ores;

FIG. 4 is a graph showing heat pattern during induration for pellets allover uniformly mixed with solid fuels;

FIGS. 5(a) and (b) are graphs showing RI, RDI and (Shutter Index) of ores indurated by a pot grate test, other process and the present process, together with the maximum temperature and the maintaining temperatures of more than 1250° C. and FIGS. 6(a) (b) and (c) are photographs enlarged by an microscope, showing agglomerated ores and sintered ores of EXP-1, EXP-4 and EXP-10 of FIG. 5.

In the drawings, the reference numerals 1 to 5, 8 and 9 are vessels of raw materials; the numeral 6 is a mixer; 7 is a disc pelletizer; 10 is a travelling grate sintering furnace; 100 is a drying zone; 101 is a firing zone; 102 is a indurating cooling zone; and 103 shows pallets.

THE MOST PREFERRED EMBODIMENT OF THE INVENTION

Explanations will be made to actual embodiments of the invention as follows.

FIG. 2 shows an outlined process for producing new agglomerated ores relating to a second invention of a producing process. Numerals 1 to 5 show vessels of raw materials for primary pelletization, from which into a mixer 6, are thrown 55% raw materials of −1 mm to be sintered, 35% pelletizing raw materials, 10% returned and agglomerated ores of less than 3 mm, 4% limestone of −1 mm, and 2% quicklime of −1 mm and they are mixed with the water. The mixed materials are undertaken with the primary pelletization within an inner disc 70 of a two-step pelletizer 7. The primary pellets are moved to an outer disc 71 by the rotation of the disc pelletizer 7. The numerals 8 and 9 designate vessels of quicklime and pulverized cokes of C.D.Q., from which 3.3% quicklime and 2.9 to 3.0% pulverized cokes of C.D.Q. are charged into the outer disc 71, and coated therewith on the surfaces of the primary pellets together with said quicklime, while adding the water, and are undertaken with the second pelletization to produce mini-pellets of 5 to 8 mm diameter. Table 1 shows grain sizes of the raw materials in the above said mini-pellet process, Table 2 shows chemical compositions thereof, and Table 3 shows the pelletizing conditions.

TABLE 1

| Raw materials (%) | Grain size (mm) | | | | | |
|---|---|---|---|---|---|---|
| | +1 | 1–0.5 | 0.5–0.25 | 0.125–0.125 | 0.125–0.074 | 0.074–0.044 | −0.044 |
| Main raw materials | 0.2 | 13.4 | 24.8 | 14.0 | 8.7 | 25.3 | 13.6 |
| Quicklime | 45.5 | 18.3 | 20.0 | | 16.2 (−0.125) | | |
| Coke powders C.D.Q. | 2.9 | 4.5 | 22.2 | 27.2 | 43.2 (−0.125) | | |

TABLE 2

| Raw materials (%) | Elements | | | | |
|---|---|---|---|---|---|
| | T.Fe | $SiO_2$ | $Al_2O_3$ | CaO | Ig. Loss |
| Main raw materials | 61.16 | 3.66 | 1.53 | 0.56 | — |
| Quicklime | — | 0.9 | — | 94.0 | 2.6 |

TABLE 3

| | |
|---|---|
| Pelletizing facility | Pan-pelletizer; Rotation number 14 rpm; Oblique angle 44° |
| Pelletizing time | Inner disc 15–20 min. Outer disc 2–3 min |
| Grain diameter | 5–8 mm φ (water 6–8%) |

Subsequently, the mini-pellets are sintered in the travelling grate typed sintering furnace 10 which comprises a drying zone 100, a firing zone 101, and an indurating-.cooling zone 102. The mini-pellets are supplied onto the pallet 103 and pass through said zones. When the mini-pellets are loaded on the pallet 103, the induration is started under a condition that the total thickness of the hearth layer+the mini pellet is 450 to 500 mm. The drying zone 100 is downward, a waste gas which has been yielded from the parts at high temperatures of the indurating.cooling zone 102 via a wind box 104a by a circulating fan 105, is utilized as a heat source. The waste gas is fed in a direction shown with an arrow, and the mini-pellets on the pallet 103 are dried. The numeral 101a of the firing zone 101 designates a firing furnace which fires a mixture of the gas of the coke oven and air on the upper layer of the mini-pellets. The mini-pellets indurated and cooled in the zone 102 are agglomerated, and crushed by a following crusher 106, and the agglomerated ores of more than 3 mm are filtered by a screen 107. Those of less than 3 mm are returned for re-using. The waste gas is absorbed via a dust collector 108 from the wind boxs 104 below the pallet 103, and discharged outside of the line via a blower 109 (excepting the waste gas staying at the parts of high temperatures of the indurating.cooling zone 102).

TABLE 4

| Thickness of layers on the grate | Hearth layer 50 mm H Pellet layer 350–450 mm H | |
|---|---|---|
| Drying zone | 250° C. 5 min. Negative pressure 300 mm Aq | |
| Firing zone | 1000° C. 1 min. Negative pressure 500 mm Aq | ⎫ Controlling to the |
| Indurating · cooling zone | 25–30 min. Negative pressure 500 mm Aq | ⎬ maximum temperature of 1270° C. |

Investigations were made to heat patterns during induration for the ores produced in the above mentioned process and heat patterns during induration for those coated overall uniformly with the solid fuels as the conventional pellet production. FIG. 3 shows the results of the former, and FIG. 4 shows the results of the latter. Upper, middle and bottom layers tell that the pellet layers on the pallet 103 are divided into three layers, and each of the temperatures of the layers is shown as the time passes. It is seen from the both figures that three layers of the present process exactly reach the object induration temperatures, and since the content of residual carbon after the induration is low, the induration was performed efficiently. It may be considered that since pulverized iron ores are pelletized and the pellets are indurated, the permeability is well satisfactory, and since the solid fuel is coated only on the surfaces of the pellets, the firing is instant, and since the pellets are so small as 5 to 8 mm in diameter, the heat easily reaches nuclei of the pellets, and because the pelletization is accelerated, the permeability is preferable within the layers. Therefore the present process is enough with the blower faculty of around 500 mmAq, while, on the other hand, the conventional sintering process requires the blower faculty of around 1500 to 2000 mmAq. Further, the travelling grate typed pellet sintering furnace uses the expensive heavy oil as the fuel to the indurating zone, but the present process uses the fuel only to the firing source of the solid fuel coated on the surfaces of the pellets. Therefore, externally supplied calory may be greatly reduced in comparison with the pellet process.

Investigations were made to yields of the agglomerated ores by the present process and the sintered ores by the conventional process. The producing yields of the sintered ores passed through the crusher 106 and the screen 107 were about 60 to 80%. Those of the present agglomerated ores were so high as more than 95%. This is why, since the ores of the present process are composed of mini-pellets, and if the condition of the agglomeration is broken and the ores are turned out minipellets, those may be used as products.

Powder cokes (−125 μm, 82%) were selected as the solid fuel, and raw materials were powder ores (−44 μm, 63%) composed of $SiO_2=3.7\%$, $Al_2O_3=1.6\%$, $CaO=5.6\%$ and $Fe_2O_3=87.4\%$. The agglomerated ores were produced in the above mentioned manner. Average properties were compared with those of the sintered ores as follows.

TABLE 5

| Items | Sintered ores | Persent agglomarated ores |
|---|---|---|
| $SiO_2$ (%) in products | 5.8 | 3.9 |
| RI (%) of JIS condition | 67.4 | 86.0 |
| Shutter strength of JIS condition | 92 | 89 |
| RDI (%) Process of pig iron producing section | 37.2 | 15.2 |

It is seen from the above results that less than 5% of SiOhd 2 in the conventional sintered ores made RDI remarkably high, but RDI in the present agglomerated ores is very low in spite of 3.9% of $SiO_2$. This is why the ratio of the secondary hematite which accelerates degradation during reduction is relatively lowered. Besides because of $SiO_2$ is low in the products and the indurating conditions are controlled, the agglomerated ores have fine structures composed of fine hematites and fine calcium ferrites. Therefore, RI is higher than that of the sintered ores since micro bores are scattered sporadically. The reason why the shutter strength is not largely lowered, depends upon that the bulk density is improved by pelletization and the strength may be maintained though the ratio of melting bond by the slag is lowered.

The inventors carried out the indurations by changing conditions, and made investigations by experiments on properties of the agglomerated ores by the present process, the agglomerated ores by the different process and the sinter obtained from the pot grate test. FIGS. 5(a) and (b) show RI(%), RDI(%), and SI(%) of +3 mm of the sintered ores (EXP-1) from the pot grate test, the agglomerated ores (EXP-9 and 10) of the present process and the agglomerated ores (EXP-2 to 8) of the different process, together with the maximum induration temperature and the maintaining temperature of more than 1250° C. FIG. 6(a) shows the photograph enlarging the fine structure by the micro scope of the sintered one of EXP-1. FIG. 6(b) shows the photograph of the sintered one of EXP-4. FIG. 6(c) shows the photograph of the present sintered one of EXP-10. In the sintered ore of EXP-1 of FIG. 6(a), the upper white parts are the secondary hematite, the gray parts are acicular calcium ferrites, and the lower white parts are the original ores. Those sintered ores have RI of 55 to 63% and RDI of 26 to 35%, and are not satisfactory in the natures of the products as seen in FIG. 5(a). The ore of FIG. 6(b) is different from that of the present process and the structure is combined by melting bond, and the ores are composed of the large secondary hematites (white parts) and the prismatic calcium ferrites (gray parts). The slag is fused into many macro bores (black parts). Therefore, it is seen from FIG. 5(a) that RI is so low as 74%, while the ores of the present process have RI of more than 85%. The structure of the ore of the present process shown in FIG. 6(c) is combined by diffusion bond, and the ore is composed of the fine calcium ferrites (gray parts) and the fine hematites (white parts), and the micro bores are scattered uniformly. With respect to the induration condition, the maximum temperature is 1260° C., and the maintaining time of above 1250° C. is 0.3 minutes to the maximum, and since these conditions satisfy the optimum induration conditions of the present invention (the maximum temperature: below 1270° C. and the maintaining time within 1 minute above 1250° C.). RI is 85% and RDI is 15% in average. Properties are very excellent.

In the pelletizing process of the mini-pellets, the primary and secondary pelletization were performed simultaneously in the two stepped disc pelletizer 7. The same results were also obtained by separately performing the primary and the secondary pelletizations. The mixture from the mixer 6 of FIG. 2 was pelletized as adding the water, and those of more than 12 mm were filtered with the 1st roller screen. The first pelletized materials of more than 12 mm were returned to the raw material vessel 3 via the crusher, and those of less than 12 mm were filtered through a second roller screen into those of more and less than 5 mm. The pellets of less than 5 mm were returned to the 1st stepped pelletizer, and the first pellets of more than 5 mm were fed to the 2nd stepped pelletizer and coated with powder cokes of C.D.Q. and quicklime. Thereafter the materials were filtered through a 3rd and 4th roller screens into those of more than 5 mm and less than 8 mm, and subjected to a constant feeder and the the travelling grate typed sintering furnace 10. The agglomerated ores obtained were similar to those as in the above mentioned examples.

INDUSTRIAL APPLICATION

The agglomerated ores by the present process have high yielding and the process is useful to obtain the agglomerated ores of excellent quality of high RI and low RDI, and may indurate iron ores so fine that the prior art could not deal with, by means of a blower of small faculty.

What is claimed is:
1. Agglomerated iron ores produced by the method comprising the steps of
adding a flux containing lime substance to iron ore comprising more than 80% hematite and less than 20% magnetite, said iron ore having a grain size 5 mm or less, to form a mixture consisting of flux and iron ore;
primarily pelletizing the mixture of flux and iron ore to form first pellets;
adding flux containing lime substance and solid fuel selected from the group consisting of grain coke, grain cha, dust coal and grain charcoal, having more than 50% of grain size of −125 μm, and in an an amount of 2.5 to 3.5 weight percent based on the amount of iron ore to the first pellets obtained from the primary pelletizing;
secondarily pelletizing the first pellets to coat the first pellets with said lime substance and solid fuel and to form minipellets from the first pellets having grain size ranging from 3 to 9 mm and having their surfaces coated with said solid fuel to effect diffusion bonding; and
processing the mini-pellets on a travelling grate sintering furnance by subjecting the mini-pellets first to drying, then subsequently to firing at a temperature of a maximum of 1270° C. for about 1 minute, then thereafter indurating and cooling, and then finally to crushing and filtering, thereby to produce agglomerated iron ores of said mini-pellets having a diameter of more than 3 mm, wherein the total amount of flux is sufficient to produce basicicity of the agglomerated ores to be in the range of 1.8 to 2.0 and wherein more than 50% of the total flux added in both the parimary and secondary pelletizing steps is added in the primary pelletizing step, so that the agglomerated iron ores comprise a plurality of substantially completely spherical pellets having a surface and consisting of a core consisting of iron ores and flux and a coated layer of said solid fuel on sasid surface of said core.

2. Agglomerated ores of claim 1, wherein said mini-pellets have diameters of 5 to 8 mm.

3. Agglomerated ores of claim 1, wherein said grain size is not more than 1 mm.

4. Agglomerated ores of claim 1, wherein said mini-pellets are bonded with calcium ferrite on their surfaces.

5. Agglomerated ores, comprising a plurality of substantially completely spherical pellets, said pellets consisting of a core having a surface and consisting of iron ores and fluxes and a coated layer of a solid fuel on said surface of said core and combined with the surface thereof by a diffusion bond, said pellets being 3 to 9 mm in diameter, and said solid fuel layer being $-125$ $\mu$m, and said iron ores of not more than 5 mm grain size comprising more than 80% hematite and less than 20% magnetite, wherein said solid fuel is selected from the group consisting of grain coke, grain char, dust coal, grain petroleum coke and grain charcoal.

6. Agglomerated ores of claim 1, wherein said solid fuel is added in an amount of more than 50% of total addition amount in a primary pelletization.

7. Agglomerated ores of claim 1, wherein said solid fuel is added in an amount of 2.5 to 3.5% in a secondary pelletization.

8. Agglomerated ores of claim 7, wherein said solid fuel is added in an amount of 2.7 to 3.0% in a secondary pelletization.

9. Agglomerated ores of claim 1, wherein said fluxes are lime substances, and are added such that basicicity in products is determined to be 1.8 to 2.0.

10. Agglomerated ores of claim 1, wherein the products by said diffusion bond have fine fabrications comprising the hematite and calcium ferrite.

11. Agglomerated ores of claim 1, wherein said pellets are 5 to 8 mm in grain diameter.

12. Agglomerated ores of claim 1, wherein $SiO_2$, as a bond strengthening agent, is added in an amount of 3.5 to 4.5%.

13. Agglomerated ores of claim 1, wherein ordinary sintered raw materials of $-125$ $\mu$m are not more than 10%, and ordinary pellets of $-44$ $\mu$mm are more than 60% in the grain iron ores as raw materials.

* * * * *